(12) United States Patent
Fouet et al.

(10) Patent No.: US 10,242,925 B2
(45) Date of Patent: Mar. 26, 2019

(54) ENCAPSULATION OF ELECTRONIC COMPONENTS IN POLYMER MATERIALS

(71) Applicant: INSTITUT VEDECOM, Versailles (FR)

(72) Inventors: Thomas Fouet, Pontarlier (FR); Philippe Banet, Acheres (FR); Linda Chikh, Maisons-Laffitte (FR); Odile Fichet, Poissy (FR)

(73) Assignees: INSTITUT VEDECOM, Versailles (FR); UNIVERSITE DE CERGY PONTOISE, Cergy-Pontoise (FR)

( * ) Notice: Subject to any disclaimer, the term of this patent is extended or adjusted under 35 U.S.C. 154(b) by 108 days.

(21) Appl. No.: 15/527,944

(22) PCT Filed: Nov. 19, 2015

(86) PCT No.: PCT/EP2015/077056
§ 371 (c)(1),
(2) Date: Jul. 3, 2017

(87) PCT Pub. No.: WO2016/083224
PCT Pub. Date: Jun. 2, 2016

(65) Prior Publication Data
US 2018/0312640 A1 Nov. 1, 2018

(30) Foreign Application Priority Data

Nov. 27, 2014 (FR) ...................................... 14 61594

(51) Int. Cl.
*H01L 23/29* (2006.01)
*H01L 33/56* (2010.01)
(Continued)

(52) U.S. Cl.
CPC ............ *H01L 23/296* (2013.01); *C08G 77/12* (2013.01); *C08G 77/20* (2013.01); *C08K 5/56* (2013.01);
(Continued)

(58) Field of Classification Search
CPC ....... H01L 23/28; H01L 23/29; H01L 23/293; H01L 23/296; H01L 33/52; H01L 33/56; H01L 21/3121; H01L 21/3122
See application file for complete search history.

(56) References Cited

U.S. PATENT DOCUMENTS 8,278,408 B2  10/2012 Goto et al.
8,440,312 B2  5/2013  Elahee
(Continued)

FOREIGN PATENT DOCUMENTS

CN  103045159 A  4/2013
EP  0247492 A2  12/1987
(Continued)

OTHER PUBLICATIONS

International Search Report for corresponding PCT/EP2015/077056, dated Apr. 1, 2016.
(Continued)

*Primary Examiner* — Eduardo A Rodela
(74) *Attorney, Agent, or Firm* — Sandberg Phoenix & von Gontard, P.C.

(57) ABSTRACT

The invention relates to an electronic component (1) comprising at least one semiconductor chip (4) and at least one substrate (6), the semiconductor chip (4) being encapsulated in a polyorganosiloxane resin (3), which is the result of hardening a composition comprising at least: one portion (A) comprising at least one polyorganosiloxane (A1) which contains at least two —CH=CH$_2$ reactive groups per molecule; one portion (B) comprising a polyorganosiloxane
(Continued)

(B1) which comprises at least two Si—H groups per molecule; and at least one hydrosilation catalyst (C1), the components (A1) and (B1) being in quantities such that the molar ratio of Si—H/—CH=CH$_2$ in the composition is no lower than 0.4.

8 Claims, 2 Drawing Sheets

(51) Int. Cl.

| | | |
|---|---|---|
| *H01L 33/52* | (2010.01) | |
| *H01L 23/28* | (2006.01) | |
| *C08G 77/12* | (2006.01) | |
| *C08G 77/20* | (2006.01) | |
| *C08L 83/04* | (2006.01) | |
| *H01L 21/56* | (2006.01) | |
| *C08K 5/56* | (2006.01) | |
| *C08L 83/00* | (2006.01) | |
| *H01L 23/24* | (2006.01) | |

(52) U.S. Cl.
CPC .............. *C08L 83/00* (2013.01); *C08L 83/04* (2013.01); *H01L 21/56* (2013.01); *H01L 23/28* (2013.01); *H01L 23/29* (2013.01); *H01L 23/293* (2013.01); *H01L 33/52* (2013.01); *H01L 33/56* (2013.01); *C08L 2203/206* (2013.01); *C08L 2205/025* (2013.01); *H01L 23/24* (2013.01); *H01L 2924/0002* (2013.01)

(56) References Cited

U.S. PATENT DOCUMENTS

| | | |
|---|---|---|
| 2015/0252191 A1 | 9/2015 | Kim et al. |
| 2016/0096984 A1 | 4/2016 | Matsumoto |
| 2017/0029571 A1* | 2/2017 | Kusunoki ................ C08K 5/56 |

FOREIGN PATENT DOCUMENTS

| | | | |
|---|---|---|---|
| EP | 1295905 A1 | 3/2003 | |
| EP | 2581954 A1 | 4/2013 | |
| EP | 2896658 A1 | 7/2015 | |
| JP | 2014/218564 | * 11/2014 | ................ C09J 9/00 |
| WO | 2014181657 A1 | 11/2014 | |
| WO | 2014041994 A1 | 8/2016 | |

OTHER PUBLICATIONS

Written Opinion for corresponding PCT/EP2015/077056, dated Apr. 1, 2016.

* cited by examiner

ENCAPSULATION OF ELECTRONIC COMPONENTS IN POLYMER MATERIALS

CROSS-REFERENCE TO RELATED APPLICATIONS

This application is the US National Stage under 35 U.S.C. § 371 of International App. No. PCT/EP2015/077056 filed on Nov. 19, 2015, which claims priority to French application number 1461594 filed on Nov. 27, 2014, the contents of which (text, drawings and claims) are hereby incorporated by reference.

BACKGROUND

The present invention relates to the use of polysiloxane-based polymer materials for the encapsulation of power electronics. It relates to articles comprising at least one electronic component encapsulated in a polysiloxane-based polymer material, in particular power modules for automotive and aeronautical electronics, and a method for their manufacture. It relates in particular to the materials obtained from a crosslinked polysiloxane resin formulated in two parts.

STATE OF THE PRIOR ART

Heat curable, two-part silicone resins have been used in various industrial applications because of their thermal stability, their dielectric and mechanical properties, their chemical resistance, and their resistance to atmospheric degradation. In the electronics industry these resins have been used as encapsulation agents and coating compounds for electronic devices such as integrated circuits. Such applications are described in particular in EP247492 and EP1295905.

However in certain applications, such as automotive and aeronautical electronics, the temperature range to which these components are subjected varies widely, i.e., from −70° C. to 300° C., and it has been found that the two-part polysiloxane resins currently used for this application do not have sufficient strength at extreme temperatures. This is manifested by the degradation of the material at high temperatures and stiffening at low temperatures. Another object is to provide formulations devoid of volatile compounds, such as, for example, solvents. The material should also have good adhesion to the substrate and an elastic modulus as low as possible. Lastly, it is desirable that the material can be prepared with short-term heat treatment.

U.S. Pat. No. 4,440,312 describes thermal interface materials obtained from a crosslinked polysiloxane resin formulated in two parts. However, these materials include substantial amounts of electrically conductive thermal and insulating fillers that are unsuitable as encapsulation materials for electronic components. They are prepared with organic solvents which are then evaporated. The mechanical properties of these materials at very low or very high temperatures are not elaborated upon in this document, and do not correspond to the parameters of the application concerned.

U.S. Pat. No. 8,278,408 describes fast-curing, long-life resins obtained from a crosslinked polysiloxane resin formulated in two parts. These resins are used in electronic applications as a material for filling the space between two substrates. These compositions include additives such as silane coupling agents, dicarboxylic acid esters, and fillers which are unsuitable as encapsulating materials for electronic components. They are prepared with organic solvents which are then evaporated. The mechanical properties of these materials at very low or very high temperatures are not elaborated upon in this document and do not correspond to the parameters of the application concerned.

EP2581954 describes encapsulating materials for heat-releasing optical devices such as LEDs. They are intended to serve as a bonding material between an LED and its support. These materials are obtained from a crosslinked polysiloxane resin formulated in two parts. They include thermal conductive fillers which are not suitable as encapsulation materials for electronic components. The thermal and mechanical stability of the materials obtained is not discussed in this document.

The Applicant has now discovered a compound which can be used in two-part heat-curable silicone resins, and which significantly eliminates the aforementioned problems and allows the coating of elements such as power modules for automotive and aeronautical electronics.

SUMMARY OF THE INVENTION

Briefly stated, an electronic component is disclosed which comprises at least one semiconductor chip and at least one substrate, the semiconductor chip being encapsulated in a polyorganosiloxane-based resin, characterized in that:

The polyorganosiloxane resin results from the curing of a composition comprising at least:

One part (A) comprising at least one polyorganosiloxane (A1) which comprises at least two —CH=CH2 groups per molecule, One part (B) comprising at least one polyorganosiloxane (B1) which contains at least two hydrosilyl Si—H reactive groups per molecule, At least one hydrosilylation catalyst (C1), The components (A1) and (B1) being in quantities such that the molar ratio Si—H/—CH=CH2 in the composition is greater than or equal to 0.4.

An object is also the use of these polyorganosiloxane resins to encapsulate a semiconductor chip of an electronic component.

Also disclosed is a process for the manufacture of an electronic component comprising at least the preparation of a polyorganosiloxane-based resin, the preparation comprising the mixture of part (A), part (B), and the catalyst (C1).

According to one embodiment of the invention, the sum of the mass of (A1) and of (B1) represents from 95% to 100% of the total mass of the composition.

According to one embodiment of the composition, the molar ratio Si—H/—CH=CH$_2$ ranges from 0.5 to 1.4.

According to one embodiment of the composition, the polyorganosiloxane (A1) is chosen from polydimethylsiloxanes, copolymers and terpolymers based on dimethylsiloxane, methylphenylsiloxane and diphenylsiloxane, bearing vinyl unsaturated groups.

According to one embodiment of the composition, the polyorganosiloxane (B1) is chosen from polydimethylsiloxanes carrying dimethylhydroxysiloxane terminal groups, copolymers and terpolymers based on dimethylsiloxane, methylhydroxysiloxane, methylphenylsiloxane, phenylhydroxysiloxane and diphenylsiloxane bearing trimethylsiloxane or dimethylhydrosiloxane terminal groups.

According to one embodiment of the composition, the polyorganosiloxane (B1) is chosen from polydimethylsiloxanes carrying terminal dimethylhydrosiloxane groups.

According to one embodiment of the composition, the polyorganosiloxane (B1) comprises:

at least one polyorganosiloxane carrying at least two hydrosilyl Si—H reactive groups per molecule, with a number average molecular weight (Mn) ranging from 10,000 to 50,000 g/mol, and at least one polyorganosiloxane carrying at least two hydrosilyl Si—H reactive groups per molecule, with a number average molecular weight (Mn) ranging from 200 to 5000 g/mol.

According to one embodiment of the composition, the catalyst (C1) is chosen from platinum-based metallic and organometallic catalyzers.

According to one embodiment of the composition, the electronic component is a power module.

According to one embodiment of the method of the composition, the mixture of the parts (A) and (B) and the catalyst (C1) is followed by heating.

DETAILED DESCRIPTION

Figure 1:
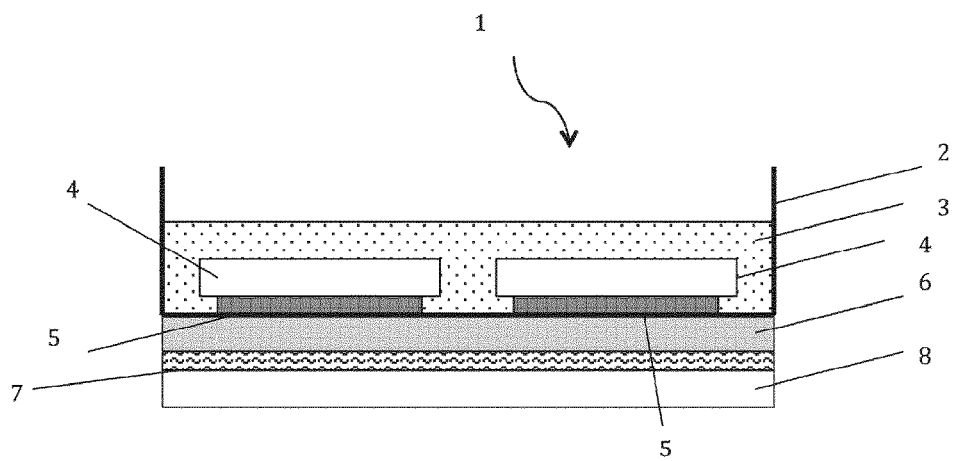
FIG. 1 is a schematic representation of a power module.

The polyorganosiloxane resin used in the invention comprises at least three components:

Part (A) comprises at least one polyorganosiloxane (A1) which comprises at least two —CH=CH$_2$ groups per molecule. The polyorganosiloxane (A1) may be linear or branched, it may be a homopolymer or a copolymer. The unsaturated group may be a vinyl, allyl, butenyl, or hexenyl group. Preferably, the unsaturated group is a vinyl. The unsaturated groups can be placed in an end and/or pendant position with respect to the polyorganosiloxane chain. The other organic groups of the chain (A1) can be chosen in a known manner from saturated, unsaturated, or aromatic monovalent organic groups. Preferably, they are selected from saturated or aromatic monovalent organic groups comprising from 1 to 20 carbon atoms. For example, alkyl groups such as methyl, ethyl, propyl, pentyl, octyl, undecyl, and octadecyl; cycloalkyls such as cyclopentyl and cyclohexyl; aromatic hydrocarbons such as phenyl, tolyl, xylyl, benzyl, and 2-phenylethyl can be used.

The polyorganosiloxane (A1) is preferably chosen from polydimethylsiloxanes, copolymers and terpolymers based on dimethylsiloxane, methylphenylsiloxane and diphenylsiloxane carrying vinyl unsaturated groups.

For example, the polyorganosiloxane (A1) may be chosen from polydimethylsiloxanes and poly (dimethylsiloxane-co-methylphenylsiloxane) carrying dimethylvinyl siloxane terminal groups.

Preferably, the vinyl groups represent from 0.8 to 1.8% of the substituents of the polyorganosiloxane (A1), advantageously from 1 to 1.5% of the substituents.

Such polymers are commercially available, and are part of a ready-to-mix two-part product, such as Sylgard 527® (Dow Corning) and Nusil 8250® (Nusil).

Part (A) may be composed of a mixture of polyorganosiloxanes (A1), the different polymers being distinguished by their molecular mass or by the chemical structure of their repeating units.

In addition to the polymer (A1), part (A) may comprise other polymers, additives, stabilizers, plasticizers, and inorganic fillers conventionally used in polymer formulations.

Part A may also contain the catalyst (C1). In some ready-mixed commercial formulations, the catalyst (C1) is present in part A.

Part (B) comprises at least one polyorganosiloxane (B1) which contains at least two hydrosilyl Si—H reactive groups per molecule. This compound (B1) makes it possible to crosslink the polymer (A1) by a hydrosilylation reaction.

The polyorganosiloxane (B1) may be linear, branched or cyclic; it may be a homopolymer or a copolymer. The Si-bonded hydrogens can be placed in the end position and/or pendant position with respect to the polyorganosiloxane chain. The other organic groups of the chain (B1) may be chosen in a known manner from saturated, unsaturated or aromatic monovalent organic groups. Preferably, they are chosen from saturated or aromatic monovalent organic groups comprising from 1 to 20 carbon atoms. For example, alkyl groups such as methyl, ethyl, propyl, pentyl, octyl, undecyl and octadecyl; cycloalkyls such as cyclopentyl and cyclohexyl; aromatic hydrocarbons such as phenyl, tolyl, xylyl, benzyl and 2-phenylethyl can be used.

For example, the polyorganosiloxane (B1) may be chosen from polydimethylsiloxanes carrying dimethylhydrosiloxane terminal groups, poly-(dimethylsiloxane-co-methylhydrogensiloxane) carrying trimethylsiloxane or dimethylhydrosiloxane terminal groups, and cyclic polyhydroxymethylsiloxanes. These polymers may also contain phenyl groups, which are very advantageous in the context of the low temperature application.

Advantageously, (B1) is chosen from polydimethylsiloxanes carrying dimethylhydroxysiloxane terminal groups, copolymers and terpolymers based on dimethylsiloxane, methylhydroxysiloxane, methylphenylsiloxane, phenylhydroxysiloxane and diphenylsiloxane carrying trimethylsiloxane or dimethylhydroxysiloxane terminal groups.

Preferably, the Si—H groups represent from 3 to 35% of the substituents of the polyorganosiloxane (B1), advantageously from 4 to 30% of the substituents.

The number average molecular weight (Mn) of (B1) is advantageously from 200 to 50,000 g/mol.

Part (B) may be composed of a mixture of polyorganosiloxanes (B1), the different polymers being distinguished by their molecular mass or by the chemical structure of their repeating units.

Advantageously (B1) comprises at least two polyorganosiloxanes carrying at least two hydrosilyl Si—H reactive groups per molecule, which differ in their molecular mass.

Advantageously (B1) comprises:

at least one polyorganosiloxane carrying at least two hydrosilyl Si—H reactive groups per molecule, the number average molecular weight (Mn) ranging from 10,000 to 50,000 g/mol, and at least one polyorganosiloxane carrier of at least two reactive groups hydrosilyl Si—H per molecule, the number average molecular weight (Mn) ranging from 200 to 5000 g/mol.

Polyorganosiloxanes carrying at least two hydrosilyl Si—H reactive groups per molecule and having a number average molecular weight (Mn) ranging from 10,000 to 500,000 g/mol are commercially available and are part of a ready-to-mix product in two parts. Examples include Sylgard 527® (available from Dow Corning) and Nusil 8250® (available from Nusil).

In certain commercial formulations, the composition (B) further comprises a polyorganosiloxane carrying vinyl reactive groups belonging to the category (A). A portion of the polyorganosiloxane carrying vinyl reactive groups (A) can thus be premixed with the polyorganosiloxane carrying Si—H groups.

Polyorganosiloxanes carrying at least two hydrosilyl Si—H reactive groups per molecule and of number average molecular weight (Mn) ranging from 200 to 5000 g/mol are commercially available. Examples include D4H®, HMS-151® and DMS-H11® marketed by the company Gelest.

In addition to the polyorganosiloxane (B1), the composition (B) may comprise other polymers, additives, stabilizers, plasticizers, inorganic fillers conventionally used in polymer compositions.

The amount of (B) is adjusted as a function of the Si—H group content of (B) and the content of unsaturated groups —CH═CH$_2$ in (A). Preferably, the amount of (B) is adjusted so that the Si—H/—CH═CH$_2$ molar ratio is from 0.45 to 1.5, preferably 0.5 to 1.4, more preferably 0.5 to 1.2.

Component (C1) is a hydrosilylation catalyst. In a known manner, (C1) is preferably chosen from metallic and organometallic catalyzers. It is chosen, for example, from a platinum group metal such as: platinum, rhodium, ruthenium, palladium, osmium or iridium metal or an organometallic compound thereof, or a mixture of such compounds. For example chloroplatinic acid, chloroplatinic acid hexahydrate, platinum dichloride and complexes of these compounds with organopolysiloxanes of low molecular weight or microencapsulated platinum compounds in a matrix can be used.

The ingredient (C1) is added to the composition in an amount ranging from 0.1 ppm to 5000 ppm, preferably from 1 to 1000 ppm, advantageously from 5 to 500 ppm by mass of platinum group metals relative to the mass of the curable composition.

When the resin composition comprises inorganic fillers, these may represent up to 70% by weight of the resin mass.

Preferably, when the resin composition comprises inorganic fillers, which comprise at most 10% by weight of the mass of the resin.

According to a preferred variant of the composition, the sum of the mass of (A1) and of (B1) represents from 95 to 100% by weight of the total mass of the composition, preferably from 98 to 100%, more preferably 99 to 100%.

After mixing the components (A), (B) and (C), the resulting non-crosslinked composition is poured onto the substrate on which the electronic chip(s) is/are placed, in the housing of the power module, making it possible to avoid the flow of the composition. A heat treatment is applied at a temperature which makes it possible to increase the kinetics of the hydrosilylation reaction.

Referring now to FIG. 1, the power module 1 comprises a substrate 6, on which are placed two electronic chips 4. Metal connectors 5 are placed between the chips 4 and the substrate 6. The chips 4 and the connectors 5 are encapsulated in a gel 3 and placed in a casing 2. The substrate 6 is separated from a cold plate 8 by an interface material 7 such as a heated grease. The housing may optionally be closed by a lid (not shown). The gel 3 has a thickness of a few millimeters and comprises a polysiloxane resin obtained by curing a composition comprising at least one polyorganosiloxane (A1), which contains at least two —CH═CH$_2$ groups per molecule, a polyorganosiloxane wherein the components (A1) and (B1) are in quantities such that the Si—H/—CH═CH$_2$ molar ratio of the hydrosilyl Si—H reactive groups per molecule, is greater than 0.4.

EXPERIMENTAL PART

1—Materials and Methods:
Silicone Gels:

The precursors of commercial bicomponent silicone gels GEL 8250 from the company Nusil and Sylgard 527 from the company Dow Corning were used. The precursors of GEL 8250 are poly(diphenylsiloxane-co-dimethylsiloxane) copolymers, in which 5% of the substituents are phenyl groups, while the precursors of Sylgard 527 are polydimethylsiloxane (PDMS) without a phenyl group.

In both cases, vinyl and hydroxysilane groups, placed along the polymer chains, allow crosslinking. Crosslinking is carried out by a hydrosilylation reaction between hydroxysilane (Si—H) functions and vinyl functions in the presence of a platinum-based catalyst (as shown in Diagram 1 below).

In order to avoid any reaction during storage before use, the precursors of the gels are conditioned in such a way that the catalyst necessary for the crosslinking is isolated from the hydroxysilane (Si—H) functions. Thus, part A contains the precursors carrying vinyl functions and the platinum catalyst, and the other part B contains precursors carrying vinyl and Si—H functions.

Diagram 1: Hydrosilylation reaction

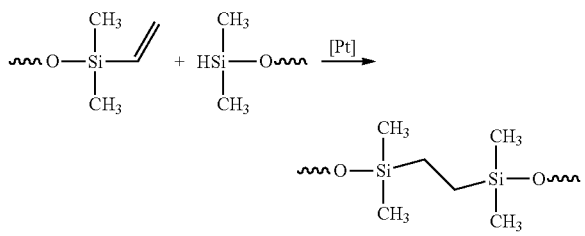

Their number average molecular mass (Mn) and weight average molecular mass (Mw) were determined by steric exclusion chromatography using tetrahydrofuran (THF) as the mobile phase, and their viscosity was determined by rheology. This data is presented in Table 1, below.

TABLE 1

Number average molecular and weight average molecular mass, polydispersity indices and viscosity of the precursors of commercial silicone gels

| Precursors | Mn (g/mol) | Mw (g/mol) | Index of polydispersity (I) | Viscosity (mPa · s) |
|---|---|---|---|---|
| GEL 8250 - Part A | 20,000 | 32,000 | 1.6 | 610 |
| GEL 8250 - Part B | 25,000 | 41,600 | 1.7 | 520 |
| Sylgard 527 - Part A | 17,500 | 26,000 | 1.5 | 310 |
| Sylgard 527 - Part B | 14,500 | 26,500 | 1.8 | 470 |

In a first step, gels GEL 8250 and Sylgard 527 were prepared by mixing parts A and B in weight ratio A/B=50/50. In order to do this the two precursors, which are slightly viscous, are placed in a pillbox and mixed about 10 min. The mixing phase entails the incorporation of air bubbles into the system, which is then placed under a vacuum for about 10 min. until the air bubbles completely disappear.

The proportions of reactive functions in an equimass mixture of parts A and B were determined from NMR $^1$H analysis of the mixtures. The results are shown in Table 2 below

TABLE 2

Si—H, Si-vinyl functionalities, commercial gels

| Commercial Gel Mixture A/B = 50/50 | % Si—H medium | % Si-Vinyl medium | % Si-Vinyl/ Si—H |
|---|---|---|---|
| GEL 8250 | 0.40 | 1.28 | 3.1 |
| Sylgard 527 | 0.48 | 1.25 | 2.4 |

Three polysiloxanes containing Si—H functions were added to these formulations. They are differentiated by their chemical structure (cyclic or linear), their functionality and the position of the reactive functions (lateral or at the end of the chain) and are described below:

A Copolymer Poly(Dimethylsiloxane-Co-Methylhydroxysiloxane) (HMS-151):

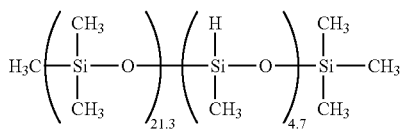

Its molecular mass was determined by RMN $^1$H at 2000 g/mol and its functionality was 4.7. 8.7% of the substituents are Si—H.

An α, ω-Dihydrogen Polydimethylsiloxane (DMS-H11):

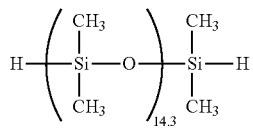

The functionality of this crosslinking agent is 2 and its molar mass determined by RMN $^1$H is 1,135 g/mol. 6.5% of the substituents are Si—H.

The 1,3,5,7-Tetramethylcyclosiloxane (D$_4$H):

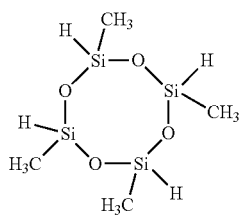

The functionality of this crosslinking agent is 4 and its molar mass is 240.5 g/mol.

These three compounds are commercially available from Gelest.

New gels were therefore prepared by mixing as previously parts A and B of GEL 8250 or Sylgard 527 in 50/50 equimass ratio, and adding the chosen crosslinking agent in different proportions. The crosslinking agent proportions are expressed in crosslinking agent mass with respect to the mass of the precursors of gels GEL 8250 or Sylgard 527.

After degassing, the mixture is molded as described above and then placed in the oven for 30 minutes at 150° C. The rate of formation of the meshes and the mechanical properties of the gels obtained were then analyzed.

The compositions prepared have an Si—H/Si-vinyl molar ratio ranging from 0.3 to 1.2.

Figure 2:
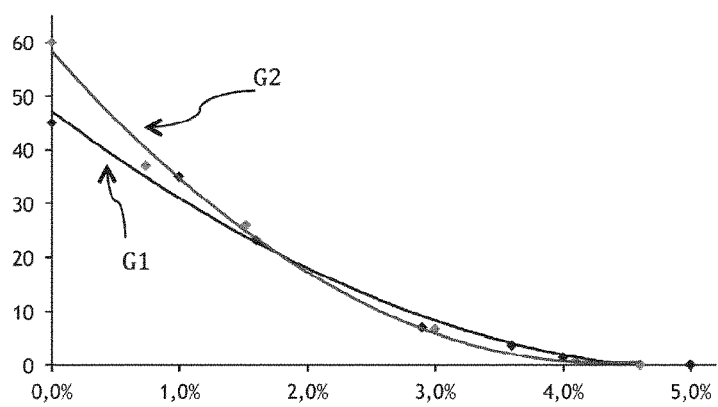
FIG. 2 is a graph representing the % mass of soluble fraction (ordinate) as a function of the % mass of polyorganosiloxane HMS-151® (abscissa) added in parts (B) Nusil 8250 (G1) and Sylgard 527 (G2)

2—Properties of Synthesized Gels:
The results are presented below:
Soluble Fraction:

The addition of polysiloxanes containing Si—H functions re-balances the proportions of the reactive functions, which results in a decrease in the soluble fractions. FIG. 2 illustrates the mass percentage of soluble fraction as a function of the mass percentage of HMS-151® added. The soluble fractions were measured on the GEL 8250 (G1) and Sylgard 527 (G2) gels synthesized by adding HMS-151® in such a proportion that the Si—H/Si-vinyl ratio varies between 0.5 and 1.2 (i.e. between 1 and 5% m of HMS-151). The results presented in FIG. 2 show that for the two gels studied, the soluble fraction decreases significantly with the addition of HMS-151, and thus with the increase of the Si—H/Si-vinyl ratio. Thus, materials without free chain are obtained for 4% m of HMS-151. From Si—H/Si-vinyl=0.83 (3.5% m HMS-151), the soluble fraction is less than 5% m, which can be considered negligible.

Follow-Up of the Disappearance of Si—H Functions by IR-Crosslinking Agent HMS-151:

The disappearance of the Si—H functions in the mixtures of the precursors of the gel GEL8250®, to which are added between 3.5 and 4.5% m of HMS-151, such that the Si—H/Si-vinyl ratio is equal to 0.83 (excess of vinyl functions), 0.95 and 1.1 (excess of hydroxysilane functions), was followed at 90° C. by infrared spectroscopy.

For the gel with a Si—H/Si-vinyl ratio of 1.1, the characteristic band of the Si—H functions does not disappear completely, which is in agreement with an excess of Si—H function. On the other hand, this band completely disappears for the ratio Si—H/Si-vinyl equal to 0.83. When this ratio is equal to 0.95, the characteristic band of the Si—H functions does not disappear completely. These results indicate that hydroxysilane functions do not fully react, since a slight excess of vinyl is required to remove all Si—H functions from the medium.

An excess of Si—H functions results in a plateau conversion rate of less than 100%. Thus, for an Si—H/Si-vinyl ratio greater than 0.83 (i.e. an HMS-151 addition of greater than 3.5% m), the conversion is no longer complete and decreases to 70% for an Si—H/Si-vinyl ratio equal to 1.1. These results make it possible to define a high limit of addition of crosslinking agent from which the presence of residual hydroxysilane functions is observed, ie 3.5% m of HMS-151.

These measurements were supplemented by a rheological analysis.

Crosslinking Speed and Storage Modulus:

TABLE 3

Characteristic of Nusil 8250 Gel to which different proportions of HMS-151 have been added

| % crosslinking agent | 0% | 0.75% | 1.2% | 2.6% | 5% |
|---|---|---|---|---|---|
| Si—H /Si-vinyl ratio | 0.31 | 0.42 | 0.5 | 0.71 | 1.17 |
| Gel time (min) | 15 | 13 | 8 | 6 | 5 |
| G' (kPa) | 1.6 | 10 | 25 | 115 | 200 |

The addition of HMS-151® allows passing on either side of the stoichiometry. Thus, the increase of the Si—H/Si-vinyl ratio causes a decrease in the gel time to a factor of 3. The storage modulus G', on the other hand, increases very significantly, since it is multiplied by 125 when this ratio increases from 0.31 to 1.17. This increase in the storage modulus is accompanied by a loss of tack of the material. Soft and sticky without addition of crosslinking agent, the material becomes harder and non-sticky when the ratio Si—H/Si-vinyl=1.17. The addition of HMS-151® provides the missing hydroxysilane functions to react with excess vinyl functions in GEL 8250® prepared in equimass proportions. This results in an increase in the number of crosslinking nodes, and therefore in the crosslinking density, and consequently in the storage modulus.

Temperature Resistance:

The resistance to temperature was compared by comparing the TGA profiles of the Nusil 8250® gel with and without HMS-151® (3.5% by mass): they are substantially identical.

Nusil 8250® with and without HMS-151® (3.5% by mass): they are essentially identical.

Figure 3:
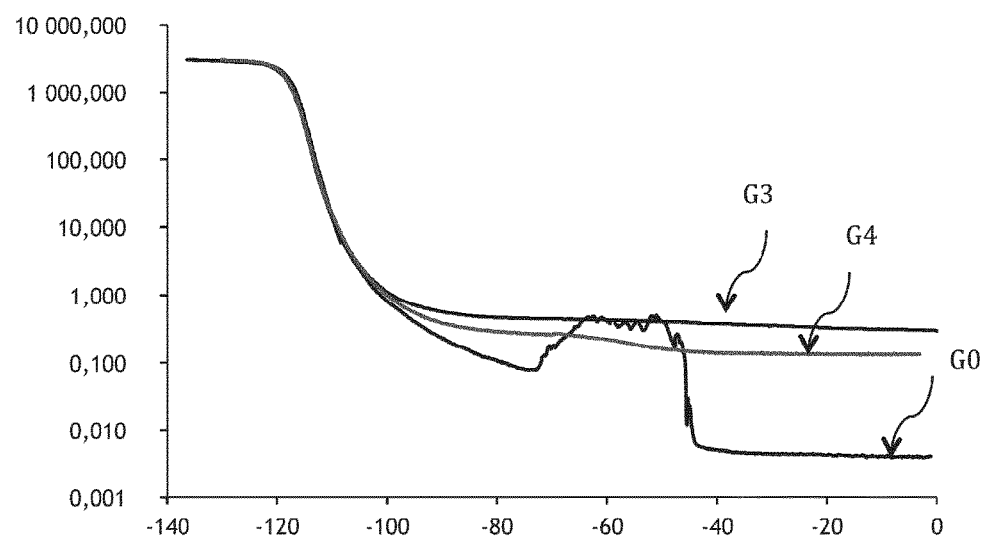
FIG. 3 is a graph representing the storage modulus (ordinate) as a function of temperature (abscissa) for Nusil 8250® Gel (G0) and for gels obtained by addition in the Nusil 8250® Gel of: 3.5 mass percent (G3) and 6.1 mass percent (G4) of polyorganosiloxane HMS-151®.

Mechanical Properties at Low Temperature:

As illustrated in FIG. 3, the addition of HMS-151 (3.5% by mass) to the Nusil 8250® gel significantly improves the stability of its storage modulus to −90° C. FIG. 3 shows that the addition of the third component makes it possible to widen the temperature range (towards low temperatures) on which the encapsulation gel retains a stable mechanical modulus, which is essential for the intended application.

Monitoring of the Disappearance of the Si—H Functions by IR—Crosslinking Agent DMS-H11:

The analysis by RMN $^1$H of the precursors of GEL 8250, and of DMS-H11® made it possible to determine that a molar ratio Si—H/Si-vinyl=1 is obtained from an equimass mixture of precursors of Nusil 8250 Gel® and 6.1% by mass of DMS-H11®. The gel formation was monitored by infrared spectroscopy at different temperatures (70° C., 100° C., and 150° C.). The rate of conversion of the Si—H functions (lateral and terminal) during the formation of the gel at the different temperatures is substantially identical. The conversion rate reaches its maximum in about 8 min, whatever the temperature. Thus, as with the HMS-151, the cross-linking speed is much faster with addition of DMS-H11 than without. The addition of DMS-H11 therefore makes it possible to synthesize a gel in about 10 minutes at lower temperatures (70° C. for example) than without this crosslinking agent (150° C. are necessary for the same duration).

It should be noted that the maximum conversion rate is around 85%, which is consistent with the excess Si—H functions mentioned above. A test was carried out with 4.6% m of DMS-H11® (instead of 6.1), i.e. an Si—H/Si-vinyl ratio equal to 0.93, has been achieved. The conversion rate then reaches 100%.

Gels Prepared from Crosslinking Agent $D_4H$:

In the case of $D_4H$, the stoichiometric proportions are obtained by adding 0.66% m of $D_4H$ in the 50/50 mixture of the precursors of GEL 8250 and 0.64% m in that of Sylgard 527.

The study of the kinetics formation of these networks showed that the addition of $D_4H$ makes it possible to significantly increase the rate of crosslinking.

Gels obtained from $D_4H$ exhibit generally advantageous properties, but when introduced in an equivalent amount, have a higher rigidity than those obtained from HMS-151 and DMS-H11.

Mechanical Properties:

This study relates only to gels synthesized by adding HMS-151 30® and DMS-H11®. The storage modulus was measured as a function of the temperature between −140° C. and 0° C., by DMTA, in order to quantify their differences in stiffness (FIG. 3).

TABLE 4

Modules for storage at 0° C. of Sylgard 527 and Nusil GEL 8250 ® gels as a function of the polysiloxane containing added Si—H functions

| Preparation | Storage modulus (kPa) | |
|---|---|---|
| | Nusil GEL 8250 ® | Sylgard 527 ® |
| Commercial gel only (A/B = 50/50) | 6 | 2 |
| With 6.1% m of DMS-H11 | 130 | 240 |
| With 3.5% m of HMS-151 | 310 | 770 |

This table shows that the choice of the polysiloxane containing Si—H functions determines the mechanical properties of the gel formed. Indeed, the chemical structure of the two polysiloxanes containing Si—H functions elaborated upon is very different (pendent functions in one case and telechelic in the other) and influences the crosslinking density of the gels.

CONCLUSION

The introduction of polysiloxanes containing Si—H functions with suitable functionality makes it possible to improve various properties of polyorganosiloxane gels.

These polysiloxanes containing Si—H functions do not change the good properties of resistance to the high temperatures of these polymers.

They improve the mechanical properties of polyorganosiloxanes at low temperatures. By adapting the nature and proportion of crosslinking agent, different modulus values can be obtained.

This technique is adaptable to all polyorganosiloxanes which can be crosslinked by hydro-silylation.

The invention claimed is:

1. An electronic component comprising at least one semiconductor chip and at least one substrate, the semiconductor chip being encapsulated in a polyorganosiloxane-based resin, wherein:

The polyorganosiloxane resin results from the curing of a composition comprising at least:

A part (A) comprising at least one polyorganosiloxane (A1) which contains at least two —CH=CH$_2$ groups per molecule, A part (B) comprising at least one polyorganosiloxane (B1) which comprises:

at least one polyorganosiloxane carrying at least two hydrosilyl Si—H reactive groups per molecule, number average molecular weight (Mn) ranging from 10,000 to 50,000 g/mol, and at least one polyorganosiloxane carrying at least two hydrosilyl Si—H reactive groups per molecule, number average molecular weight (Mn) ranging from 200 to 5,000 g/mol, at least one hydrosilylation catalyst (C1), The components (A1) and (B1) being in quantities such that a molar ratio of Si—H/—CH=CH$_2$ in the composition ranges from 0.5 to 1.4.

2. The electronic component according to claim 1 wherein the sum of the masses of (A1) and (B1) represents from 95 to 100% of the total mass of the composition.

3. The electronic component according to claim 1, in which the polyorganosiloxane (A1) is chosen from polydimethylsiloxanes, copolymers and terpolymers based on dimethylsiloxane, methylphenylsiloxane and diphenylsiloxane, carrying vinyl unsaturated groups.

4. The electronic component according to claim 1, in which the polyorganosiloxane (B1) is chosen from polydimethylsiloxanes carrying dimethylhydroxysiloxane terminal groups, copolymers and terpolymers based on dimethylsiloxane, methylhydroxysiloxane, methylphenylsiloxane, phenylhydroxysiloxane and diphenylsiloxane, having terminal trimethylsiloxane or dimethylhydroxysiloxane groups.

5. The electronic component according to claim 1, in which the polyorganosiloxane (B1) is chosen from polydimethylsiloxanes carrying terminal dimethylhydroxysiloxane groups.

6. The electronic component according to claim 1, wherein the catalyst (C1) is selected from metallic and organometallic catalyzers based on platinum.

7. The electronic component according to claim 1 which is a power module.

8. A method of manufacturing the electronic component of claim 1, wherein the method comprises at least the preparation of a polyorganosiloxane-based resin, said preparation comprising the mixture of part (A), part (B) and the catalyst (C1).

* * * * *